(12) United States Patent
Kishibata

(10) Patent No.: US 8,115,289 B2
(45) Date of Patent: Feb. 14, 2012

(54) ONBOARD ELECTRIC POWER CONTROL DEVICE

(75) Inventor: Kazuyoshi Kishibata, Numazu (JP)

(73) Assignee: Kokusan Denki Co., Ltd., Shizuoka-Ken (JP)

( * ) Notice: Subject to any disclaimer, the term of this patent is extended or adjusted under 35 U.S.C. 154(b) by 400 days.

(21) Appl. No.: 12/488,796

(22) Filed: Jun. 22, 2009

(65) Prior Publication Data

US 2009/0322149 A1 Dec. 31, 2009

(30) Foreign Application Priority Data

Jun. 27, 2008 (JP) ................................. 2008-168960

(51) Int. Cl.
*H01L 23/02* (2006.01)

(52) U.S. Cl. ........ 257/678; 257/415; 257/684; 257/685; 257/687; 257/700; 257/E23.044; 438/106

(58) Field of Classification Search .................. 257/415, 257/678, 684, 685, 687, 700, E23.044; 438/106
See application file for complete search history.

(56) References Cited

FOREIGN PATENT DOCUMENTS

JP 6-45518 A 2/1994

*Primary Examiner* — Thanh V Pham

(74) *Attorney, Agent, or Firm* — Pearne & Gordon LLP

(57) ABSTRACT

An onboard electric power control device which comprises a power unit, a control unit and a power source unit, in which: an opening portion of a case containing components of the power unit and an opening portion of a case containing components of the control unit are abutted so as to be coupled; a case of the power supply unit is fitted to an opening portion being provided on a side surface of the case of the power unit so that the both cases are coupled; the power unit and the control unit is connected by a flexible connecting conductor; and the connecting conductor is folded and is contained between a resin molded portion formed inside of the case of the power unit and a resin molded portion formed inside of the case of the control unit.

10 Claims, 9 Drawing Sheets

ONBOARD ELECTRIC POWER CONTROL DEVICE

TECHNICAL FIELD OF THE INVENTION

The present invention relates to an onboard electric power control device mounted on a vehicle such as an automobile.

PRIOR ART OF THE INVENTION

On vehicles such as automobiles, it is mounted an electric power control device which comprises: a power section having a power circuit; a control section having a control circuit for controlling at least the power circuit; and a power source section having a large-sized part or parts which include(s) a power capacitor, a relay for protecting a circuit when a battery is reversely connected, and the like.

In the present invention, the power section indicates a section comprising a circuit (a power circuit) such as a rectifier circuit and an inverter circuit. These circuits are consisted of electric parts to which a relatively large current flows. The control section indicates a section which comprises a control circuit having electronic components to which a relatively small signal current flows and controlling at least the power circuit. The large-sized part indicates a part such as the power capacitor and the relay, which is larger than semiconductor parts. The power source section indicates a section related to a power source of the power circuit and the control section, which has the large-sized component such as the power capacitor and the relay.

Each constitution of the power section, control section, power source section defers according to a load to which an electric power is supplied. For example, when a starter generator, which operates as the starter motor at start of the engine and operates as a magneto generator after the starting operation, is mounted on an engine, it is provided the electric power control device which controls an electric power supplied from the battery to the starter generator and controls a charging power supplied from the starter generator to the battery after the engine starts. In this electric power control device, the power section is constituted by the power circuit which supplies a drive current from the battery to the starter generator at the start of the engine and supplies a charging current from the starter generator to battery after the starting operation. Although the control section comprises a circuit which controls at least the power circuit, a circuit which controls an ignition device, a fuel injection equipment or the like may be comprised also. In this case, the power capacitor is connected across the battery. Also, a relay for protecting a circuit when the battery is reversely connected may be provided on the power source section.

In a recreational vehicle, it is provided a power source device in which a generator is driven by the engine to supply commercial frequency electric power to various load such as consumer electrical appliances when the vehicle is stopped. In this case, a power section is constituted by a converter circuit for converting an AC output of the generator to a DC output and an inverter circuit for converting the DC output of the converter circuit to an AC output having commercial frequency. The control section comprises at least the circuit which controls the inverter circuit in this case; however, the circuit may control an ignition device or a fuel injection device of the engine in addition to the control of the inverter circuit.

It is sometimes required to constitute the onboard electric power control device as one unit by combining the power section, the control section and the power source section. An electronic unit which combines a power section and a control section is disclosed in Japanese Patent Application Laid-Open Publication no. 6-45518. In the electronic unit disclosed in Japanese Patent Application Laid-Open Publication no. 6-45518, electronic components comprising the power section and electronic components comprising the control section are separately attached to different circuit boards, and wiring patterns of both circuit boards are connected each other through a rigid connecting pin. Both circuit boards are contained in a case, and components contained in the case are molded by resin filled entirely in the case.

When a construction of the unit disclosed in Japanese Patent Application Laid-Open Publication no. 6-45518 is applied to the onboard electric power control device having the power section, the control section and the power source section, a large-sized case is required in order to contain the components comprising the power section and control section and large components such as a capacitor being provided on the power source section. In this case, dead space is formed around the large-sized component. When resin is cast into the case, it is necessary to fill the resin also into the dead space around the large components, which entails an increase in production costs because larger amount of resin into the case is needed.

In order to prevent the dead space from being formed around the large-sized component such as a power source capacitor, it is presumable to use a case which is modeled an outer figure of the large-sized components. However, since such a case has significantly complex figure and needs an expensive mold for its production, higher production cost cannot be avoided when such a case is used.

As shown in the unit disclosed in Japanese Patent Application Laid-Open Publication no. 6-45518, in case that a circuit board to which components comprising the power section is attached and a circuit board to which components comprising the control section is attached are connected by the rigid connecting pin, force that tries to pull the connecting pin from the circuit boards, which is caused by thermal expansion of resin between the circuit boards, is applied to the circuit boards when a temperature of the power section increases, since coefficient of thermal expansion of the connecting pin is smaller than that of resin around the connecting pin. Thus, when increase and decrease in temperature of resin are repeated according to changes in temperature of the power section at which heating value is large, fatigue occurs at a soldered portion between the connecting pin and the circuit board, which may cause damage to the soldered portion and break an electronic connection between the power section and the control section.

In order to prevent the above described problem, it is presumable to use a flexible print circuit board (FPC) to connect between the circuit board mounting components for constituting the power section and the circuit board mounting components for constituting the control section. However, when FPC is embedded in the mold resin, since strain is caused in a conductor of FPC by differences in coefficient of thermal expansion between the FPC and the mold resin, the conductor of FPC becomes fatigue when a thermal cycle o the mold resin is repeated, which cause troubles such as breaking of the conductor.

Also, when all components are housed in a common case, as shown in Japanese Patent Application Laid-Open Publication no. 6-45518, even if at least one component of the control section and the power source section is changed, it is necessary to redesign the entire case, which is not economical.

Especially, in the power source section, since the size of the power source capacitor is subject to change, or a relay for protecting a circuit when the battery is reversely connected may be provided or may not be provided, the constitution of the power source section is often changed. If the conventional constitution is used, it is necessary to redesign the entire case even if only the constitution of the power supply portion is changed, which causes the cost required for changing the design to increase.

SUMMARY OF THE INVENTION

An object of the present invention is to provide an onboard electric power control device which can be integrated with a power section, a control section and a power supply portion without increasing an amount of resin being poured into a case.

Another object of the present invention is to provide an onboard electric power control device which can avoids a possibility that electric connection between a power section and a control section is impaired by temperature change.

Further object of the present invention is to provide an onboard electric power control device in which cost for changing design can be decreased.

The present invention is applied to an onboard electric power control device which comprises a power section having a power circuit, a control section having a control circuit which controls at least the power circuit, and a power source section having large-sized component including a power source capacitor.

In the present invention, there are provided three units, a power unit which is constructed so as to house, in a first case, a first circuit board mounting components of the power section, a control unit which is constructed so as to house, in a second case, a second circuit board mounting components of the control section and a power source unit which is constructed so as to house large-sized component(s) of the power source section in a third case. By abutting each opening portion being provided on the first case and the second case to couple each other, the power unit and the control unit are mechanically coupled. On a side of the first case, a side opening portion having a fitting portion for fitting the third case is provided. The third case is fitted to the side opening portion while a portion in which the large-sized component are housed is positioned outside of the first case, and the side opening portion of the first case is closed by the third case. Then, a first resin molded portion, which covers components of the power circuit together with the first circuit board, is provided in the first case, and a second resin molded portion, which covers components of the control section together with the second circuit board, is provided in the second case. In the third case, a third resin molded portion which covers at least an electrical conducting portion of the large-sized component (s) of the power source section. Further, the power unit and the control unit are electrically connected by a flexible and flat conductor which is folded and housed in a space formed between the first and second resin molded portions.

When the power source section having the large-sized component is constructed as a separate unit as aforementioned, the cases of the power unit and the control unit are required to have enough size for housing the circuit board to which small-sized electronic components are attached, not large-sized components; therefore, it is possible to avoid dead space in the cases and to prevent an amount of mold resin for filling the dead space from increasing. Also, since a third resin molded portion being provided on the power supply unit may be provided so as to mold at least the electrical conducting portion of the large-sized component, it is possible to save resin required for forming the mold portion. Thus, with the above-described constitution, the amount of mold resin can be decreased as a whole, which can reduce the cost.

Also, when the onboard electric power control device is divided into the power unit, the control unit and the power supply unit and is assembled by mechanically coupling these units, structure of coupling portions of the units can be standardized. If the structure of the coupling portions of the units is standardized, when it is necessary to change design of a part of the units and change size or form of the case body of the unit, only the case body of the unit which design is changed is required to be changed if needed, and it is not necessary for the cases of other units to change their design. Therefore, cost required for design change can be reduced.

Especially, in the power supply unit, it often occurs that the size of the capacitor is changed and that the relay is provided or not provided. Following to these changes, the case of the power supply unit is required to be changed. In this case, if a measurement of a fitting portion and a fitting structure between the case of the power supply portion and a side opening portion of the case of the power unit are standardized, the change of the case of the power source unit can be handled without any changes in the power unit and the control unit.

Also, as stated above, when the portion between the power unit and the control unit is electrically connected by the flexible and flat conductor, and the conductor is contained in the space between the resin molded portion of the power unit and the resin molded portion of the control unit, since strain is never caused in the conductor even if the mold resin repeatedly expands and contracts by a thermal cycle of the power unit, it is possible to prevent the electronic connection between the power unit and the control unit from becoming impaired.

In a preferable aspect of the present invention, the above third resin molded portion is provided so as to cover a portion required for covering the electrical conducting portion of the large-sized component, which cause at least a part of a body of the large-sized component to be exposed without being covered with the third resin molded portion.

In the preferable aspect of the invention, one end and the other end of the above-described connecting conductor are soldered to a land being provided on the first circuit board and a land being provided on the second circuit board, respectively. The one end and the other end of the connecting conductor are pushed against the first and second circuit boards by pressing plates being fixed to the first and second circuit boards, respectively.

When the connection between the connecting conductor and the circuit boards are made by soldering, not by a connector, and the one end and the other end of the connecting conductor are pushed against the first and second circuit boards by pressing plates being fixed to the first and second circuit boards, respectively, it is possible to avoid that the connecting conductor is detached from the first and second circuit boards when tension is applied to the connecting conductor in the assembling of the onboard electric power control device.

It is preferable that the fixture of the first pressing plate to the first circuit board is performed by soldering the first pressing plate to the land being provided on the first circuit board, and that the fixture of the second pressing plate to the second circuit board is performed by soldering the second pressing plate to the land being provided on the second circuit board.

As described above, by soldering the first and second pressing plates to the lands being provided on the first and second circuit boards in order to fix the first and second pressing plates to the first and second circuit boards, respectively, it is possible to fix the first and second pressing plates to the first and second circuit boards without using screws or rivets; therefore, number of components can be reduced to prevent the cost from increasing.

In the preferable aspect of the invention, the first circuit board being provided on the power unit consists of a circuit board which base is made by metal such as aluminum. The circuit board is arranged so as to be thermally coupled to a bottom wall portion of the first case (so that heat is conducted from the circuit board to the bottom wall portion of the first case). On an outer surface of the bottom wall portion of the first case, heat radiation fins are provided.

If configured in the above manner, the heat radiation from the power circuit can be performed efficiently, thus preventing the temperature of the power unit from increasing.

BRIEF DESCRIPTION OF THE DRAWINGS

The above and other objects and features of the invention will be apparent from the detailed description of the preferred embodiment of the invention, which is described and illustrated with reference to the accompanying drawings, in which.

DETAILED DESCRIPTION OF THE PREFERRED EMBODIMENTS

Now, a preferred embodiment of the present invention will be described in detail with reference to the drawings.

The present invention is applied to an onboard electric power control device which comprises a power section having a power circuit to which a large current flows for controlling a supply of an electric power, a control section having a control circuit for controlling at least the power circuit, and a power supply section having a large-sized component including a power supply capacitor.

An embodiment that the present invention is applied to the onboard electric power control device for controlling a starter generator which is mounted on an engine is set forth hereinafter. The onboard electric power control device according to the embodiment drives a starter generator as a brushless motor at start of the engine to perform cranking of the engine, and drives the starter generator as a generator to control the starter generator so as to charge a battery with an output from the starter generator.

The starter generator is, a well-known type rotating electrical machine which comprises: a magnet rotor being attached to, for example, a crankshaft of the engine; a stator having multi-phase armature coils; and a Hall sensor for detecting polarity of magnetic pole of the magnet rotor which passes a detecting position being set with respect to each phase of the armature coil. This rotating electrical machine is driven as the brushless motor at start of the engine to rotate the crankshaft of the engine, and operates as a magneto generator, by being driven by the engine, to induce a multi-phase AC voltage to the armature coil. In this embodiment, the starter generator includes three-phase armature coils.

Figure 1:
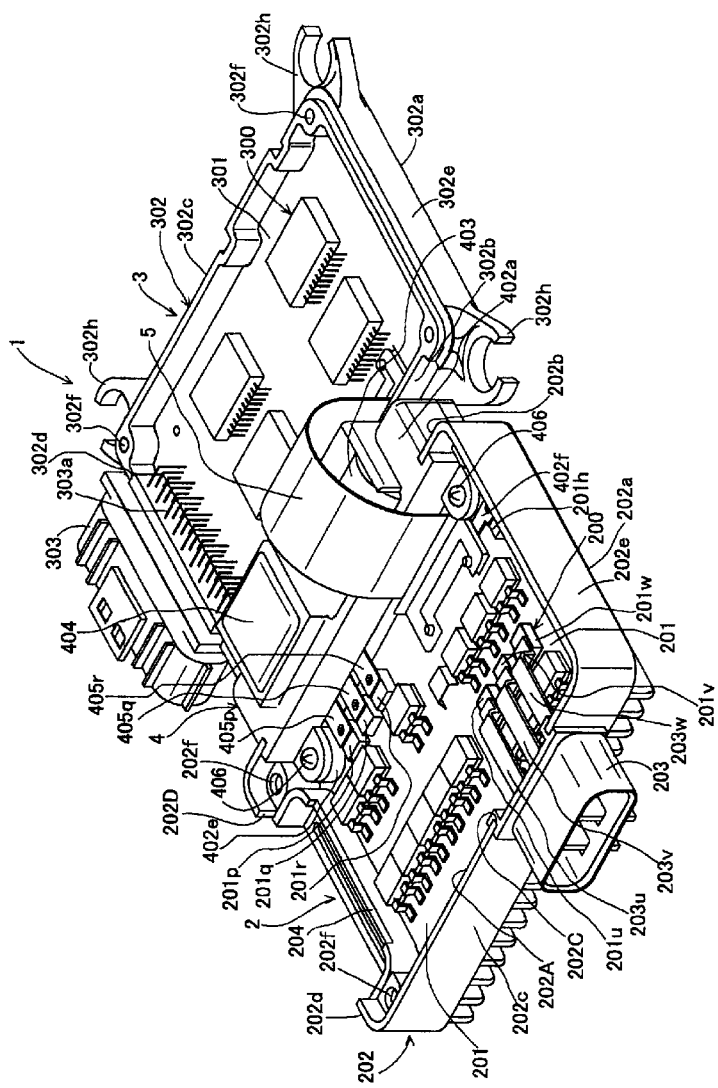
FIG. 1 is a perspective view showing an electric power control device having a power unit, a control unit and a power supply unit being coupled with the power unit according to an embodiment of the present invention in a condition in which resin molded portions are not yet formed.

In FIG. 1, a reference numeral 1 denotes an onboard electric power control device. In this invention, the electric power control device 1 consists of three units which are a power unit 2, a control unit 3 and a power supply unit 4.

The power unit 2 comprises a first circuit board 201 to which a component 200 of a power section having a power circuit such as an inverter circuit is mounted, a first case which is flat (a measurement of height is smaller than that of length and width) and rectangular-parallelepiped-shaped and contains the first circuit board 201, and a connector 203 being attached to the first case 202.

Figure 2:
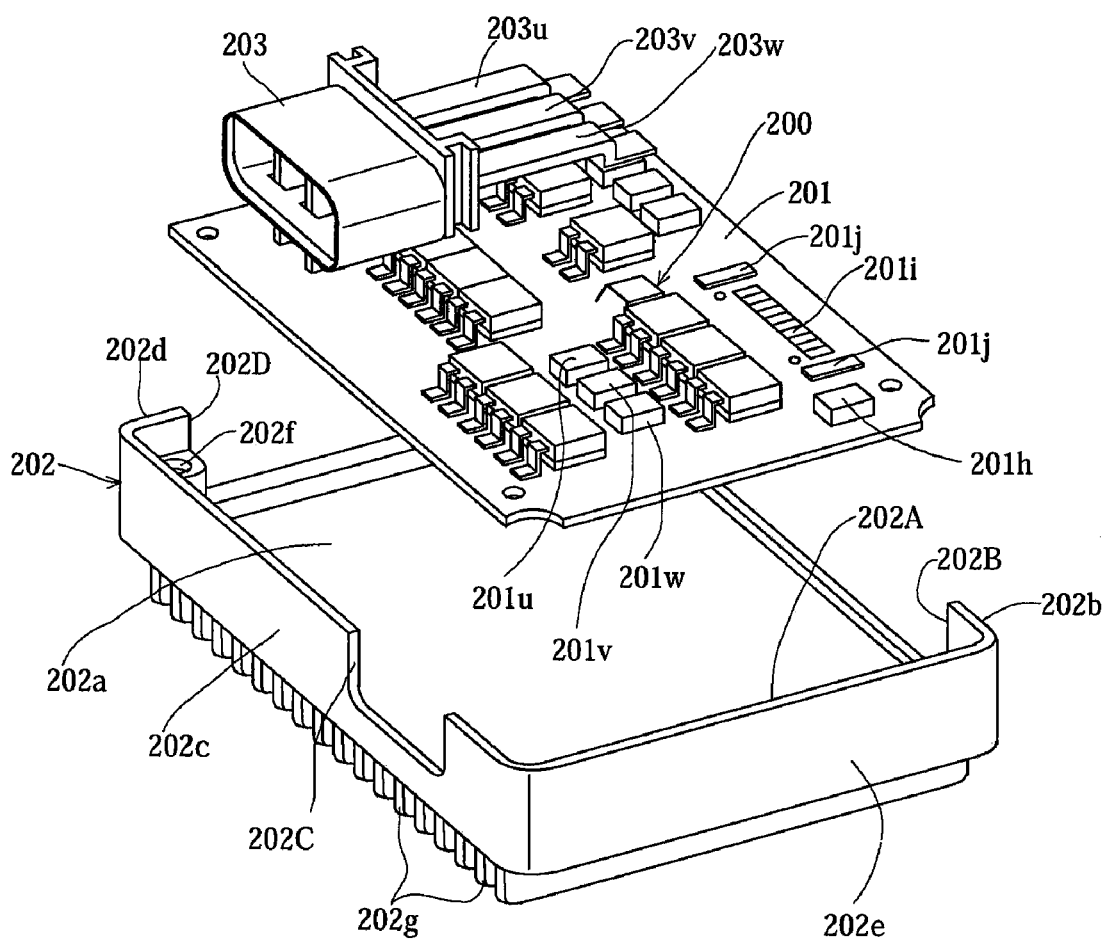
FIG. 2 is an exploded perspective view showing a configuration of the power unit used in the embodiment of the present invention.

As shown in FIG. 2, the first case 202 is made of aluminum and includes a rectangular bottom wall portion 202a, two side wall portions 202b and 202c being provided along two long sides of rectangle of the bottom wall portion 202a, and two side wall portions 202d and 202e being provided along two short sides of rectangle of the bottom wall portion 202a. On the bottom wall portion 202a of the side wall portions 202b to 202e and an end portion on an opposite side of the bottom wall portion, a first main opening portion 202A is formed so as to be open-ended in only one direction (in FIG. 1, only an upper portion is opened).

On the side wall portion 202b along one long side of the bottom wall portion 202a, it is provided a side opening portion 202B penetrating the side wall portion 202b. The opening portion 202B is opened to a direction perpendicular to the opening direction of the first main opening portion 202A. The side opening portion 202B is used for fitting a case of the power source unit 4.

On the side wall portion 202c opposed to the side wall portion 202b onto which the side opening portion 202B is provided, a connector mounting opening 202C is provided, and on the side wall portion 202d along on short side of the bottom wall portion 202a, a connector mounting opening 202D is provided. The opening portion 202B and the connector mounting openings 202C and 202D consist of an U-shaped groove.

On each inner side of four corners of the first case 202, a boss portion having a tapped hole 202f is formed. Onto an inner side of the connector mounting opening 202D of the first case 202, an adapter 204 is fitted. The adapter 204 is secured to the case 202 by suitable fixing means, and the opening 202D is closed by the adapter 204. The adapter 204 receives the connector being attached to a control unit which is described later. The figure and size of the adapter 204 correspond to the figure and size of the connector being received by the adapter 204. In order to enable various kinds of connectors which figure and size are different to be received, various kinds of adapters suitable for various figure and size of the connectors are prepared and the suitable adapter 204 is fitted to the opening 202D. In the outer surface of the bottom wall portion 202a of the case 202, a large number of heat radiation fins 202g are formed.

The first circuit board 201 mounting the components of the power section having the power circuit consists of a rectangular circuit board which uses a metal plate such as copper and aluminum as a base. The first circuit board 201 is secured to the bottom wall portion 202a of the first case 202 and is thermally coupled to the bottom wall portion 202a.

The connector 203 is provided for connecting, to the power circuit, a three-phase armature coil of the starter generator being attached to the engine. The connector 203 has grooves at both ends of its housing. The connector 203 is secured to the first case, by fitting an edge portion of the connector mounting opening 202C of the first case 202 to the grooves at both ends of the housing of the connector 203.

To the connector 203, a connector (not shown), to which an electric wire linking to the armature coil of the starter generator is connected, is inserted. The connector 203 includes bus bars 203u to 203w consisting of three copper strips to which the three-phase armature coil is connected, and the bus bars 203u to 203w are soldered to pads (electrodes) 201u to 201w being provided on the first circuit board 201. The battery is connected to a terminal portion (not shown) being provided on a lower surface of the power supply unit 4 through an electric wire.

The power circuit being constituted by an electronic component mounted on the first circuit board 201 includes, for example: an inverter circuit which flows an electric current to the three-phase armature coil of the starter generator using the battery as a power source when the starter generator is driven as a starter motor (a brushless motor) at the start of the engine; a rectifier circuit which rectifies an AC output of the starter generator when the starter generator is driven as a generator after the start of the engine; a driver circuit which supplies a drive signal to switch elements comprising the inverter circuit such as FET; and a constant voltage supplying circuit which provides a power source voltage to components such as a microprocessor being provided on the control unit 3.

Figure 4:
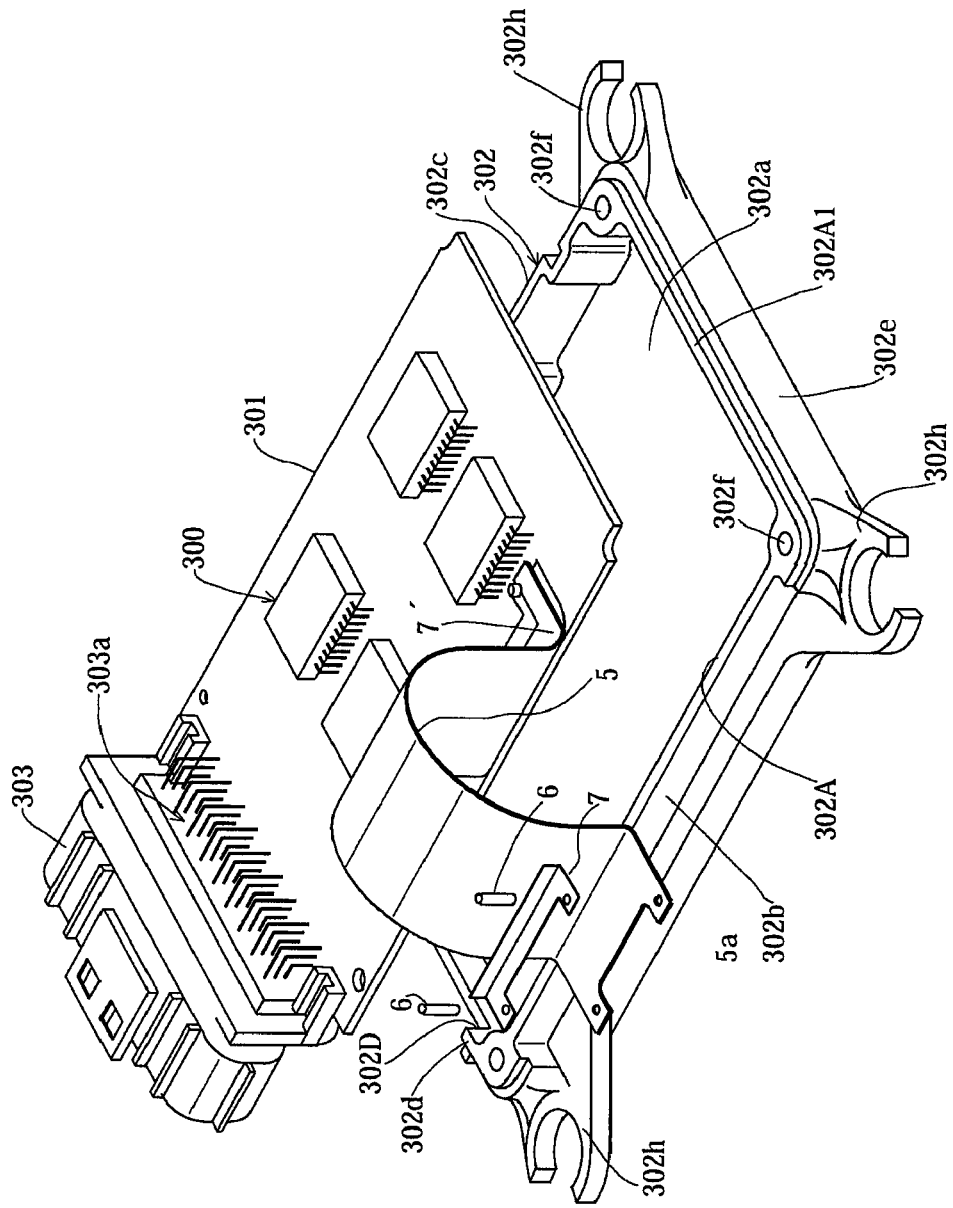
FIG. 4 is an exploded perspective view showing a configuration of the control unit used in the embodiment of the present invention.

As shown in FIG. 4, the control unit 3 comprises a second circuit board 301 mounting a component 300 of the control section such as the microprocessor, a flat and rectangular-parallelepiped second case 302 which contains the second circuit board 301, and a connector 303 having a group of terminals 303a which are soldered to the second circuit board 301. To the connector 303, other connector (not shown) being attached to a wire harness connecting to various sensors is inserted, and various signals required for controlling are supplied to the control unit through the connector 303.

The second case 302 is made by aluminum like the first case 202 and comprises a rectangle bottom wall portion 302a, two side wall portions 302b and 302c being provided along two long sides of the bottom wall portion 302a, respectively, and two side wall portions 302d and 302e being provided along two short sides of the bottom wall portion 302a, respectively. On end portions of the side wall portions 302b to 302e, which are opposed to the bottom wall portion 302a, of the second case 302, a second main opening portion 302A which is opened toward one direction (upward in FIG. 1) is formed. Also, on the side wall portion 302d being provided at one end in longitudinal direction of the second case 302, an opening portion 302D for fitting a part of the connector 303 is provided. On four corners of the second case 302, there are provided through holes 302f into which screws used for fastening the second case 302 onto the first case 201 penetrate. The through holes 302f being provided on each corner of the second case 302 are provided so as to fit together with the tapped holes 202f on the four corner of the first case 202. On the opening portion 302A of the second case 302, a fitting portion 302A1 being fitted to the inside of the opening portion 202A of the first case 202 is formed. On outer surfaces of the four corners of the second case 302, brackets 302h which comprise C-shaped mounting holes are formed. These brackets are used when the electric power control device according to this embodiment is attached to the vehicle.

The second circuit board 301, which mounts the electric component 300 for constituting the control section and onto which the connector 303 is attached, is inserted to the second case 302 with the connector 303 being fitted to the opening portion 302D of the second case 302.

Figure 3:
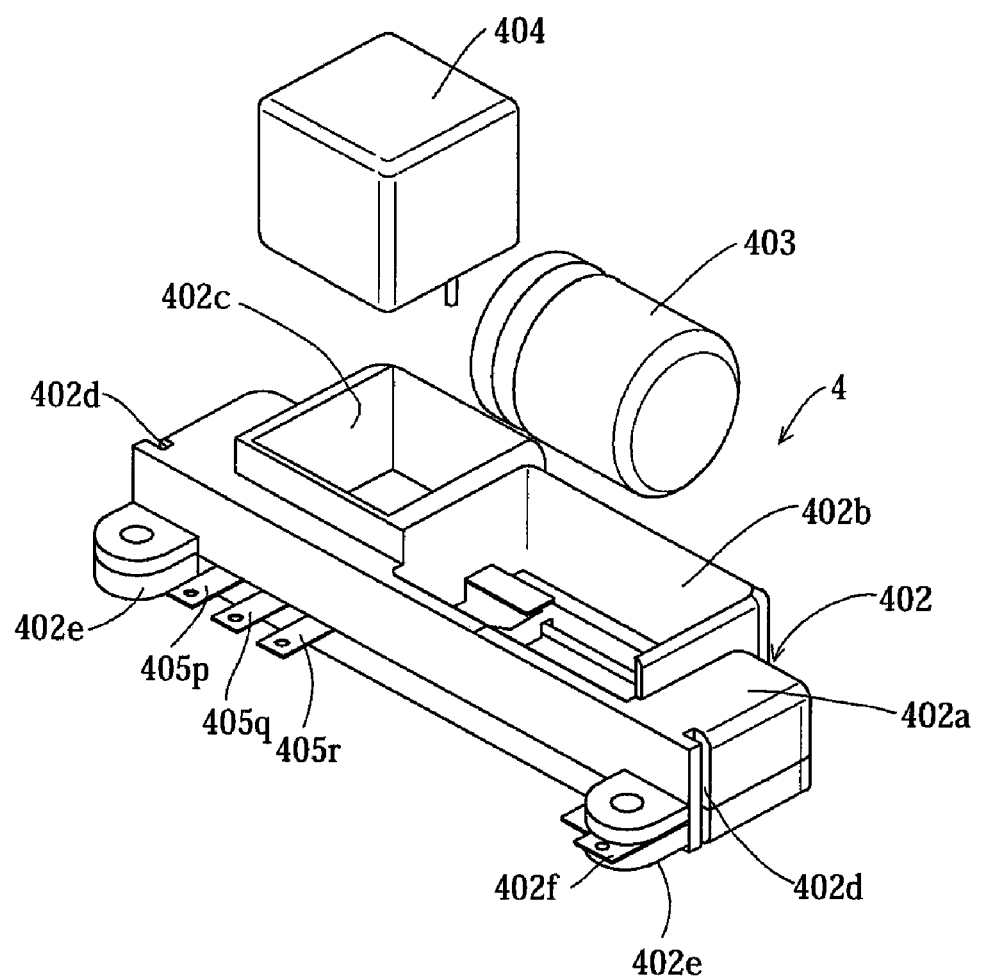
FIG. 3 is an exploded perspective view showing a configuration of the power supply unit used in the embodiment of the present invention.

FIG. 3 shows a constitution of the power supply unit 4. The power supply unit 4 comprises a third case 402 consisting of resin molded form. A body portion 402a of the third case 402 is nearly rectangular-parallelepiped shaped. The third case 402 has two recesses 402b and 402c which are opened upward. A power source capacitor 403 which is a larger component compared to the components of the power circuit and control section is housed inside of the recess 402b. Inside of the recess 402c, a relay 404 which is also large-sized like the capacitor 403 is housed. The relay 404 operates for protecting the power circuit when the battery is reversely-connected incorrectly.

On both longitudinal ends of the body portion 402a of the third case, grooves 402d are formed so that an edge portion of the side opening portion 202B of the first case 202 is fitted to these grooves 402d.

The third case 402 is arranged so that a portion for containing the large-sized components is positioned outside of the first case 202, and edge portions of the side opening portion 202B are inserted to the grooves 402d at the longitudinal ends of the third case 402. Thus, the third case 402 is mechanically coupled to the first case 202, and the side opening portion 202B of the first case 202 is closed by the third case 402.

Below the longitudinal both ends of the body portion 402a of the third case 402, brackets 402e are provided. The brackets 402e are provided so as to protrude into the first case 202 when the third case 402 is fitted to the side opening portion 202B of the first case 202 so that the third case is attached to the first case. With these brackets 402e being fastened to the bottom wall portion of the first case 202 by screws 406 (refer to FIG. 1), the third case 402 is secured to the first case 202.

Onto the third case 402, one end portion of bus bars 405p, 405q and 405r are molded. Bus bars 405p, 405q and 405r are arranged to be protruded into the first case 202 in order to electrically connect the power supply unit 4 to the power unit 2. These bus bars are connected to the pads 201p, 201q and 201r being provided on the first circuit board 201. Also, an earth terminal bracket 402f which is connecting to an earth circuit of the power supply unit is molded to one of the brackets 402e of the third case 402. This earth terminal bracket is connected to the pad 201h being provided on the first circuit board.

In this embodiment, a structure of the fitting portion of the third case 402 and the side opening portion 202B of the first case 202 is normalized. Therefore, even if the forms and sizes of the first case 202 and the third case 402 are changed, the structure and measurement of the fitting of the third case 402 and the side opening portion 202B of the first case 202 are not changed. For example, the recess 402c is not provided if the relay 404 is omitted, and only the capacitor 403 is provided on the power supply portion. However, in this case, the structure of the fitting portion of the third case 402 and the side opening portion 202B of the first case 202 is not changed.

A flexible and flat connecting conductor 5 electrically connects between the power unit 2 and the control unit 3. It can be used, as the connecting conductor 5, a flat cable in which a flat conductor is covered with a flexible insulating sheathe, a flexible printed circuit board (FPC) in which a conductive pattern is formed on one or both surface of a flexible board, or the like.

In this embodiment, a double face FPC, in which a large number of strip-shaped conducting patterns are parallely formed one surface and flat conducting patterns are formed the other surface, is used as the connecting conductor 5. On one surface at both ends of the connecting conductor 5, a plurality of terminal patterns being connected to the plurality of the strip-shaped conducting patterns, respectively, are formed, and each terminal pattern on one end side of the connecting conductor 5 is soldered to the land being provided on the second circuit board 301 of the control unit.

In this embodiment, in order to prevent the soldered portion of the connecting conductor and each circuit board from being detached when tensile force is applied to the connecting conductor 5 in the process of assembling the device, a first pressing plate 7 and a second pressing plate 7' are provided which press the connecting conductor 5 against the first circuit board 201 and the second circuit board 301 at a connecting portion between the connecting conductor 5 and the first circuit board 201 and a connecting portion between the connecting conductor 5 and the second circuit board 301.

Figure 5:
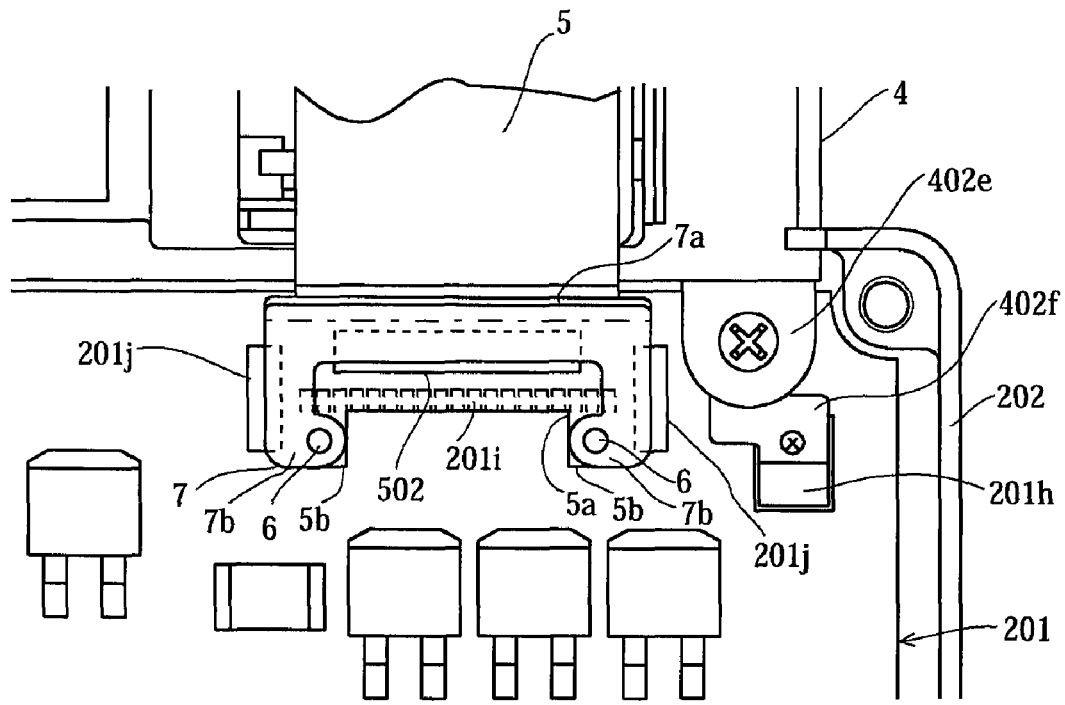
FIG. 5 is an enlarged plan view of a principal section showing a structure of a connecting portion between a circuit board and a connecting conductor for connecting across the power unit and the control unit according to the embodiment of the present invention.
Figure 6:
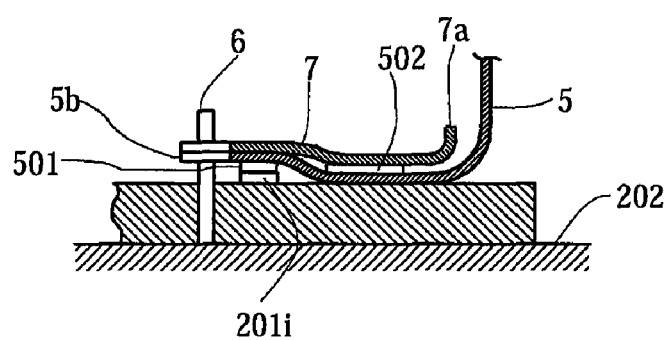
FIG. 6 is a sectional view showing the connecting portion between the connecting conductor and the circuit board used in the embodiment of the present invention.

FIGS. 5 and 6 show an example of a structure of the connecting portion between the connecting conductor 5 and the first circuit board 201. In this example, a shallow U-shaped notch 5a is formed at an end portion on the first circuit board side of the connecting conductor 5, and positioning pins 6 secured to the first circuit board are fitted to holes being provided on projecting parts 5b of the connecting conductor which are formed on both sides of the notch. With these positioning pins 6, a series of terminal patterns 501 being connected to the plurality of conductors provided on one side of the connecting conductor 5, respectively, are positioned with respect to the plurality of lands 201i provided on the circuit board 201, and each terminal pattern 501 is soldered to the corresponding land 201i.

On the other surface of the end portion of the connecting conductor 5, the strip-shaped terminal patterns 502 connecting to the flat patterns formed on the other surface of the connecting conductor, and a C-shaped first pressing plate 7 made by a copper plate is provided on the terminal patterns 502. Positioning pins 6 are fitted to holes formed on projecting parts 7b being provided at both ends of the pressing plate 7, which cause the pressing plate 7 to be positioned against the terminal patterns 502. The positioning pins 6 combine means for positioning the connecting conductor 5 and means for positioning the pressing plate 7. The pressing plate 7 is secured to the circuit board 201 by soldering lower surfaces of both ends of the pressing plate 7 to earth lands 201j formed on the circuit board 201, and the end portion of the connecting conductor 5 is pushed against the circuit board 201 by the pressing plate 7. The earth lands 201j are connected to earth pattern of the circuit board 201, flat pattern being formed on the other surface of the connecting conductor 5 is electrically connected to the earth pattern of the circuit board 201 through the terminal pattern 502, the pressing plate and the earth lands 201j. On the end portion on the connecting conductor side of the pressing plate 7, a curved rising portion 7a is formed. The curved rising portion 7a of the pressing plate 7 operates to prevent the connecting conductor 5 from being bent excessively when tensile force is applied to the connecting conductor 5. A connecting portion between the connecting conductor 5 and the circuit board 301 of the control unit is constituted in the same manner as the above description, and the end portion of the connecting conductor 5 on the side of the second circuit board 301 is pressed against the circuit board 301 by the second pressing plate 7' soldered to the land being provided on the circuit board 301.

Figure 7:
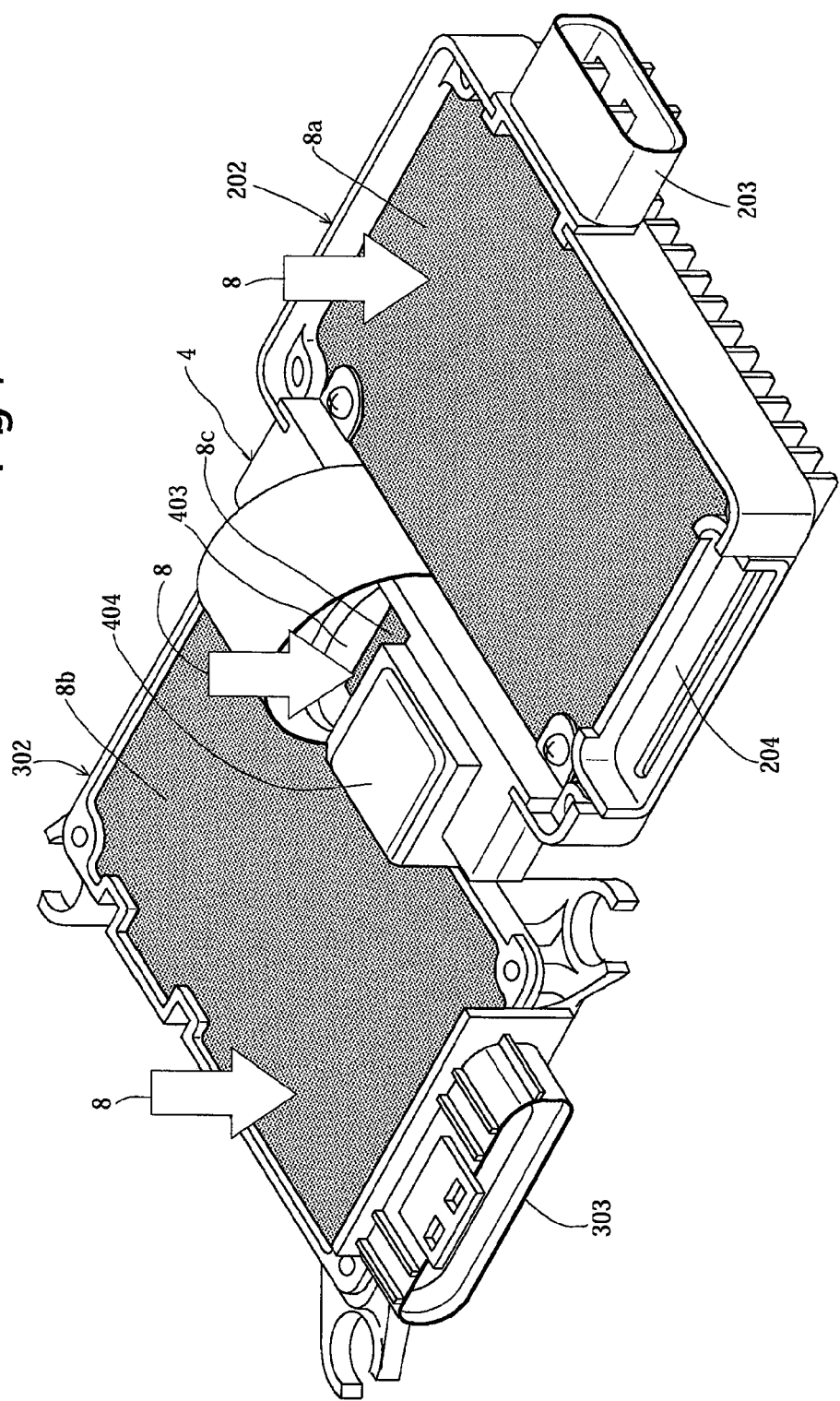
FIG. 7 is a perspective view showing a condition in which mold resin is poured into cases of the power unit, the control unit and the power supply unit, in a process for assembling the onboard electric power control device according to the embodiment of the present invention.

After connecting the power unit 2 to the control unit 3 by the flexible connecting conductor 5 as described above, thermo-setting resin such as epoxy resin is casted in the case 202 of the power unit 2, the case 302 of the control unit 3 and the recesses 402b and 402c of the case 402 of the power supply unit 4. This allows a first resin molded portion 8a which molds, with resin, the component 200 of the power circuit and the first circuit board 201 together, a second resin molded portion 8b which molds, with resin, the second circuit board 301 and the component 300 of the control section being attached to the circuit board 301, and a third resin molded portion 8c which molds, with resin, at least an electric conducting portion of the large-sized component of the power supply section, to be formed. These resin molded portions can be formed efficiently by casting resin 8 from above into the cases of each unit as indicated with arrows, while three units 2 to 4 are arranged as shown in FIG. 7.

The first resin molded portion 8a is provided so as to completely cover the component 200 of the power circuit and the first circuit board 201, and the second resin molded portion 8b is provided so as to completely cover the component 300 of the control section and the second circuit board 301. However, the third resin molded portion 8c is provided so as to cover only a portion required for covering the electrical conducting portions of the large-sized components 403 and 404, and thus at least a part of the bodies of the large-sized components 403 and 404 is exposed from the third resin molded portion to outside.

Figure 8:
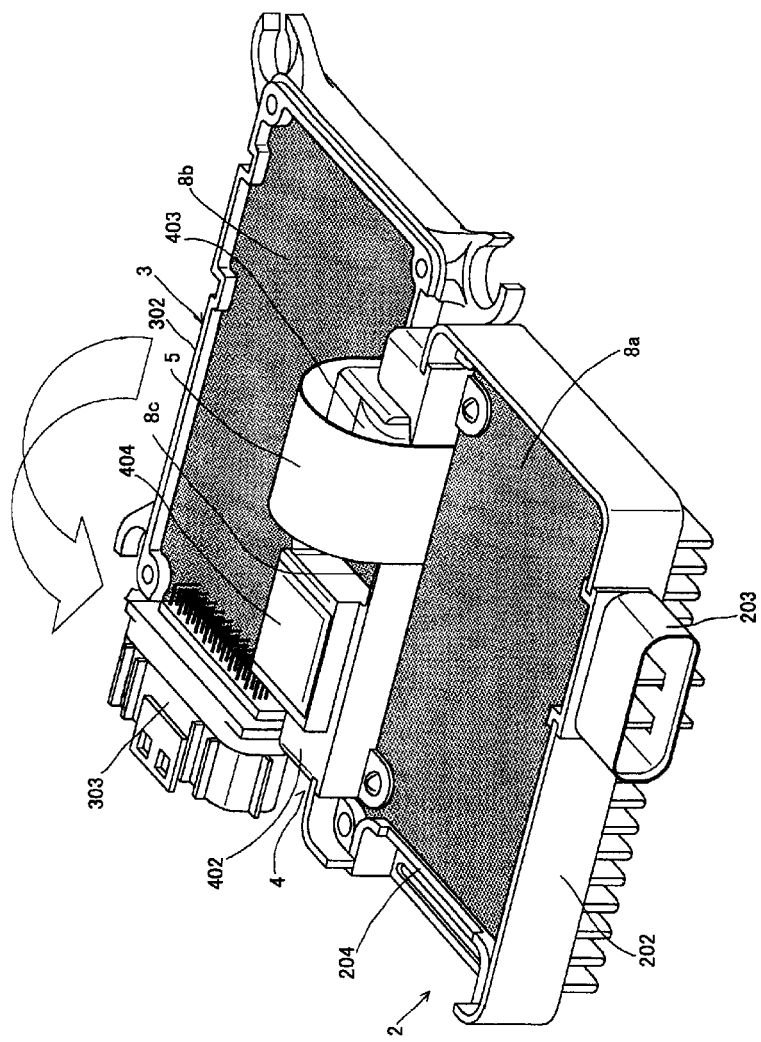
FIG. 8 is a perspective view showing the power unit, the control unit and the power supply unit in a condition in which the mold resin is poured into the cases and cured, in the process for assembling the onboard electric power control device according to the embodiment of the present invention.

As described above, as shown in FIGS. 8 to 10, the control unit 3 is reversed after forming the resin molded portions in each case, the connecting conductor 5 is double-folded, the opening portion 302A of the second case 302 of the control unit is abutted to the opening portion 202A of the first case 202 of the power unit, the fitting portion 302A1 being provided on the opening portion of the second case 302 is fitted to the opening of the first case 202, and the connector 303 is fitted to the adopter 204 being attached to the first case 202. Thus, an abutted portion of the first case and the second case is constituted so as to seal the first case 202 and the second case 302, when the first case 202 is abutted to the second case 302. Also, depth of the first case 202 and the second case 302 is set so that a space necessary for housing the folded connecting conductor 5 is formed between the first resin molded portion 8a and the second resin molded portion 8b, when the control unit 3 is reversed to make the opening portion 302A of the second case 302 of the control unit abut to the opening portion 202A of the first case 202 of the power unit.

Figure 9:
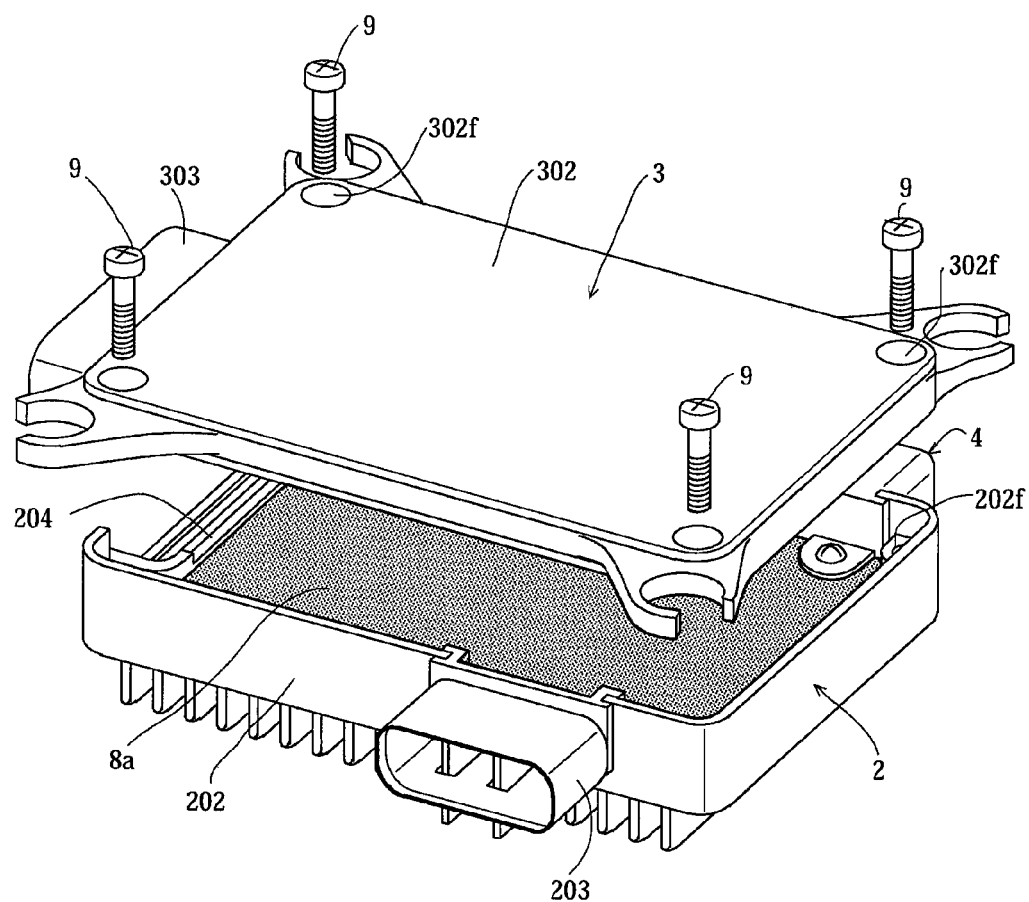
FIG. 9 is a perspective view showing a condition in which an opening portion of the case of the control unit is abutted against an opening portion of the case of the power unit to couple these cases each other, in the process for assembling the onboard electric power control device according to the embodiment of the present invention.
Figure 10:
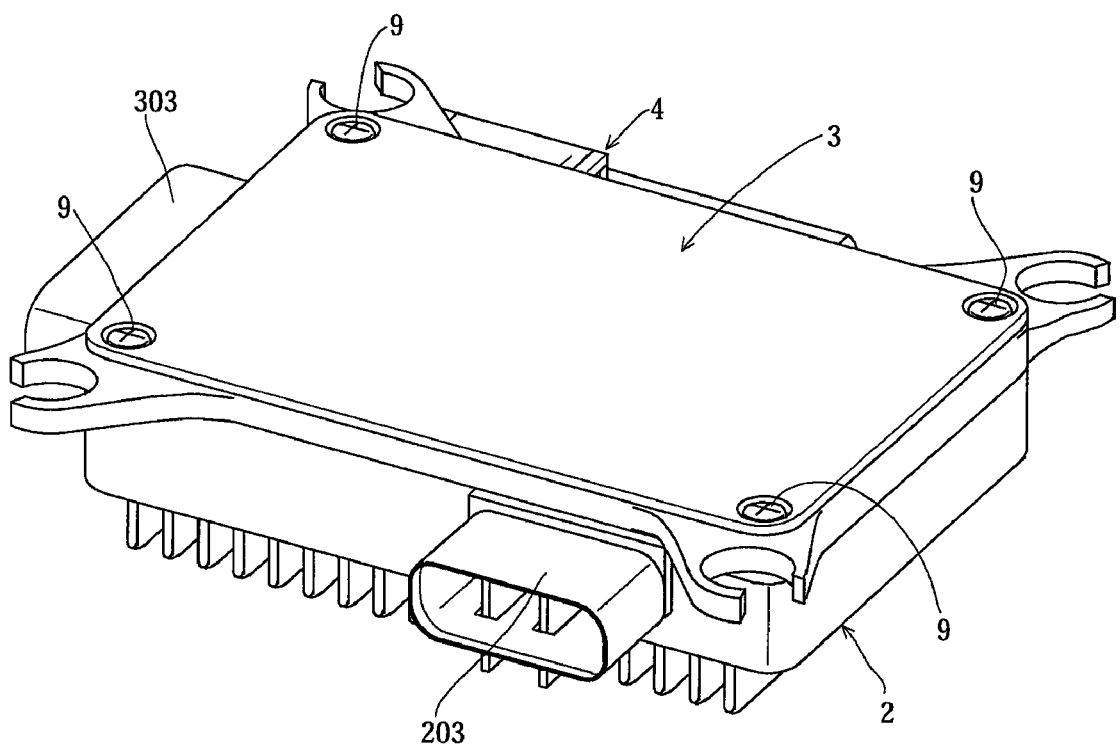
FIG. 10 is a perspective view showing a condition in which the coupling of the opening portion the case of the control unit and the opening portion of the case of the power unit is completed, in the process for assembling the onboard electric power control device according to the embodiment of the present invention.

Then, as shown in FIGS. 9 and 10, screws 9 penetrating the through holes 302f being provided on the second case 302 are screwed into the tapped holes 202f of the first case 202 to fix the second case 302 to the first case 202 by the screws in order to complete the assembling of the onboard electric power control device 1.

In the onboard electric power control device of this embodiment, since the device is divided into three units, the power unit 2, the control unit 3 and the power source unit 4, it is not necessary to house a large-sized component of the power supply section in the cases of the power unit 2 and the control unit 3. Therefore, the size of the cases 202 and 302 of the power unit 2 and the control unit 3 can be minimized, which prevent dead space from being formed in the cases 202 and 203 and reduce an amount of resin to be filled in the cases. Also, in the power supply unit 4, since the resin molded portion is formed so that only the portion necessary for covering the electrical conducting portion of the large-sized component, the amount of mold resin used in the device can be reduced as a whole, which lead the reduction in cost.

In the above embodiment, the onboard electric power control device is divided into three units, the power unit 2, the control unit 3 and the power supply unit 4, and the coupling portion between these units is normalized. With such a constitution, when design of a part of units is changed, it becomes necessary to change only parts other than the coupling portion between the case of the unit which design is changed and other unit, and a whole case is not required to be changed. Therefore, reduction in cost required for changing design can be made.

Especially in the power supply unit 4, change in design often happen such as change in size of the capacitor 403 and change for setting or not setting the relay 404. In this case, by normalizing a size and a fitting structure of the fitting portion of the case 402 of the power supply unit 4 and the side opening of the case 202 of the power unit, change of the power supply unit can be handled without making changed in the power unit 2 and the control unit 3.

As described in the above embodiment, if the power unit 2 and the control unit 3 are electrically connected by the flexible and flat connecting conductor 5 to constitute the connecting conductor 5 so as to be contained in the space between the resin molded portion of the power unit and the resin molded portion of the control unit, it is possible to prevent distortion from being generated on the connecting conductor when expansion and contraction are repeatedly occurred in the mold resin 8a by the thermal cycle of the power unit 2, thus preventing electrical connection between the power unit 2 and the control unit 3 from becoming impaired.

As described in the above embodiment, when one and the other end of the conducting portion of the connecting conductor 5 are soldered and connected to the lands being provided on the first and second circuit boards, respectively, and the end portions of the connecting conductor on the side of the first and second circuit boards are pressed against the first and second circuit boards using the first and second pressing plates 7 and 7' secured to the first and second circuit boards 201 and 301, respectively, the possibility that the connecting conductor is separated from the first circuit board 201 and the second circuit board 301 can be removed if tensile force is acted on the connecting conductor in the process for assembling the onboard electric power control device.

Also, as described in the above embodiment, when the pressing plates 7 and 7' are soldered to the lands of the circuit boards, it is possible to secure the pressing plates to the circuit boards without using any fastening members such as screws and rivets. Thus, number of components and mounting process in the onboard electric power control device can be reduced to reduce the production cost. However, the present invention is not limited to the case in which the pressing plates are soldered to the circuit boards as aforementioned, and thus the pressing plates may be screwed, for example.

Although the preferred embodiment of the invention has been described and illustrated with reference to the accompanying drawings, it will be understood by those skilled in the art that it is by way of examples, and that various changes and modifications may be made without departing from the spirit and scope of the invention, which is defined only to the appended claims.

What is claimed is:

1. An onboard electric power control device which comprises a power section having a power circuit, a control section comprising a control circuit for controlling at least said power circuit, and a power source section having a large-sized component or components including a power capacitor, wherein three units, a power unit, a control unit and a power supply unit are provided, said power unit being constructed so that a first circuit board mounting components of the power section is housed in a first case, said control unit being constructed so that a second circuit board mounting components of the control section is housed in a second case, and said power unit being constructed by said large-sized component(s) of the power source section and a third case housing the large-sized component, said power unit and said control unit are mechanically coupled each other while an opening portion being provided on the first case and an opening portion being provided on the second case are abutted each other, a side opening portion having a fitting portion for fitting said third case to a side of said first case, said third case is fitted to said side opening portion while a portion housing said large-size component is positioned outside of said first case, to close the side opening portion of the first case by said third case, a first resin molded portion covering the components of the power circuit together with the first circuit board is formed in the first case, a second resin molded portion covering the components of the control section together with the second circuit board is formed in the second case, a third resin molded portion covering at least an electrical conducting portion of the large-sized component of said power source section is formed in the third case, said power unit and said control unit are electrically connected by a flexible and flat connecting conductor, and said connecting conductor is folded and contained in a space being formed between said first resin molded portion and said second resin molded portion.

2. The onboard electric power control device according to claim 1, wherein one end and the other end of said connecting conductor are soldered to a land being provided on said first circuit board and a land being provided on said second circuit board, respectively, an end portion of said connecting conductor on the first circuit board side is pushed against said first circuit board by a first pressing plate secured to the first circuit board, and an end portion of said connecting conductor on the second circuit board side is pushed against said second circuit board by a second pressing plate secured to the second circuit board.

3. An onboard electric power control device which comprises a power section having a power circuit, a control section comprising a control circuit for controlling at least said power circuit, and a power source section having a large-sized component or components including a power capacitor, wherein three units, a power unit, a control unit and a power supply unit are provided, said power unit being constructed so that a first circuit board mounting components of the power section is housed in a first case, said control unit being constructed so that a second circuit board mounting components of the control section is housed in a second case, and said power unit being constructed by said large-sized component(s) of the power source section and a third case housing the large-sized component, said power unit and said control unit are mechanically coupled each other while an opening portion being provided on the first case and an opening portion being provided on the second case are abutted each other, a side opening portion having a fitting portion for fitting said third case to a side of said first case, said third case is fitted to said side opening portion while a portion housing said large-size component is positioned outside of said first case, to close the side opening portion of the first case by said third case, a first resin molded portion covering the components of the power circuit together with the first circuit board is formed in the first case, a second resin molded portion covering the components of the control section together with the second circuit board is formed in the second case, a third resin molded portion covering at least an electrical conducting portion of the large-sized component of said power source section is formed in the third case, said power unit and said control unit are electrically connected by a flexible and flat connecting conductor, said connecting conductor is folded and contained in a space being formed between said first resin molded portion and said second resin molded portion, said third resin molded portion is provided so as to cover only a portion required for concealing said electrical conducting portion of the large-sized components, and at least a part of a body portion of said large-sized component is exposed without being covered by said third resin molded portion.

4. The onboard electric power control device according to claim 3, wherein one end and the other end of said connecting conductor are soldered to a land being provided on said first circuit board and a land being provided on said second circuit board, respectively, an end portion of said connecting conductor on the first circuit board side is pushed against said first circuit board by a first pressing plate secured to the first circuit board, and an end portion of said connecting conductor on the second circuit board side is pushed against said second circuit board by a second pressing plate secured to the second circuit board.

5. The onboard electric power control device according to claim 2, wherein the first pressing plate and the second pressing plate are soldered to a land being provided on the first circuit board and a land being provided on the second circuit board, respectively, so as to be secured to said first circuit board and said second circuit board.

6. The onboard electric power control device according to claim 4, wherein the first pressing plate and the second pressing plate are soldered to a land being provided on the first circuit board and a land being provided on the second circuit board, respectively, so as to be secured to said first circuit board and said second circuit board.

7. The onboard electric power control device according to claim 1, wherein said first circuit board consists of a circuit board using a metal plate as a base and is thermally coupled to a bottom wall portion of said first case, and heat radiation fins are provided on an outer surface of said bottom wall portion of the first case.

8. The onboard electric power control device according to claim 2, wherein said first circuit board consists of a circuit board using a metal plate as a base and is thermally coupled to a bottom wall portion of said first case, and heat radiation fins are provided on an outer surface of said bottom wall portion of the first case.

9. The onboard electric power control device according to claim 3, wherein said first circuit board consists of a circuit board using a metal plate as a base and is thermally coupled to a bottom wall portion of said first case, and heat radiation fins are provided on an outer surface of said bottom wall portion of the first case.

10. The onboard electric power control device according to claim 4, wherein said first circuit board consists of a circuit board using a metal plate as a base and is thermally coupled to a bottom wall portion of said first case, and heat radiation fins are provided on an outer surface of said bottom wall portion of the first case.

* * * * *